(12) United States Patent
Yuan et al.

(10) Patent No.: US 12,193,229 B2
(45) Date of Patent: Jan. 7, 2025

(54) SEMICONDUCTOR DEVICE FABRICATION

(71) Applicant: Yangtze Memory Technologies Co., Ltd., Hubei (CN)

(72) Inventors: Bin Yuan, Wuhan (CN); Zhu Yang, Wuhan (CN); Xiangning Wang, Wuhan (CN); Chen Zuo, Wuhan (CN); Jingjing Geng, Wuhan (CN); Zhen Guo, Wuhan (CN); Zongke Xu, Wuhan (CN); Qiangwei Zhang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 888 days.

(21) Appl. No.: 17/213,471

(22) Filed: Mar. 26, 2021

(65) Prior Publication Data

US 2022/0181349 A1 Jun. 9, 2022

Related U.S. Application Data

(63) Continuation of application No. PCT/CN2020/133888, filed on Dec. 4, 2020.

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC .............. H10B 43/00–50; H10B 69/00; G11C 16/0466–0475; G11C 27/005; G11C 11/5671; G11C 16/02; H01L 2924/1451
See application file for complete search history.

(56) References Cited

U.S. PATENT DOCUMENTS 10,103,169 B1 10/2018 Ge et al.
2001/0005620 A1* 6/2001 Tanigami .......... H01L 21/76819
438/584

(Continued)

FOREIGN PATENT DOCUMENTS

CN 107591406 A 1/2018
CN 208298828 U 12/2018

(Continued)

OTHER PUBLICATIONS

Ying-Hsueh Chang Chien et al 2018 J. Electrochem. Soc. 165 H3187 (Year: 2018).*

(Continued)

*Primary Examiner* — Eric A. Ward
*Assistant Examiner* — Nora T. Nix
(74) *Attorney, Agent, or Firm* — Oblon, McClelland, Maier & Neustadt, L.L.P.

(57) ABSTRACT

Aspects of the disclosure provide methods for fabricating semiconductor devices. In some examples, a method for fabricating a semiconductor device includes forming a stack of layers having a first region and a second region. The stack of layers includes at least a first layer. The method then forms a hard mask layer on the stack of layers in the first region. Then, the method includes patterning the stack of layers in the second region of the semiconductor device. The patterning of the stack of layers in the second region removes a portion of the stack of layers in the second region, and exposes a side of the stack of layers. The method further includes covering at least the side of the stack of layers with a second layer that has a lower remove rate than the first layer, and then the method includes removing the hard mask layer.

20 Claims, 10 Drawing Sheets

(56) References Cited

U.S. PATENT DOCUMENTS

| | | | | |
|---|---|---|---|---|
| 2013/0065386 | A1* | 3/2013 | Kim | H10B 43/40 |
| | | | | 257/E21.409 |
| 2014/0175617 | A1* | 6/2014 | Antonelli | H01L 21/67207 |
| | | | | 257/632 |
| 2014/0357079 | A1 | 12/2014 | Tanwar et al. | |
| 2015/0279852 | A1* | 10/2015 | Mizutani | H10B 41/27 |
| | | | | 257/315 |
| 2018/0166454 | A1* | 6/2018 | Pyon | H10B 41/20 |
| 2021/0210499 | A1* | 7/2021 | Jhothiraman | H10B 41/10 |
| 2022/0108895 | A1* | 4/2022 | Watanabe | H01L 21/76804 |
| 2022/0189976 | A1* | 6/2022 | Chakravarthi | H10B 43/35 |

FOREIGN PATENT DOCUMENTS

| | | |
|---|---|---|
| CN | 109524416 A | 3/2019 |
| CN | 111769115 A | 10/2020 |
| TW | 201820420 A | 6/2018 |
| TW | 201913972 A | 4/2019 |

OTHER PUBLICATIONS

Combined Chinese Office Action and Search Report issued Oct. 11, 2021 in Patent Application No. 202080003899.6 (with English translation of Category of Cited Documents), 9 pages.

International Search Report Issued Sep. 1, 2021 in PCT/CN2020/133888, 5 pages.

* cited by examiner

SEMICONDUCTOR DEVICE FABRICATION

RELATED APPLICATION

This application is a bypass continuation of International Application No. PCT/CN2020/133888, filed on Dec. 4, 2020. The entire disclosure of the prior application is hereby incorporated by reference in its entirety.

TECHNICAL FIELD

The present application describes embodiments generally related to semiconductor memory devices and fabrication process to form the semiconductor memory devices.

BACKGROUND

Semiconductor manufactures developed vertical device technologies, such as three dimensional (3D) NAND flash memory technology, and the like to achieve higher data storage density without requiring smaller memory cells. In some examples, a 3D NAND memory device includes a core region and a staircase region. The core region includes a stack of alternating gate layers and insulating layers. The stack of alternating gate layers and insulating layers is used to form memory cells that are stacked vertically. The staircase region includes the respective gate layers in the stair-step form to facilitate forming contacts to the respective gate layers. The contacts are used to connect driving circuitry to the respective gate layers for controlling the stacked memory cells.

SUMMARY

Aspects of the disclosure provide methods for fabricating semiconductor devices. In some examples, a method for fabricating a semiconductor device includes forming a stack of layers having a first region and a second region. The stack of layers includes at least a first layer. The method then forms a hard mask layer on the stack of layers in the first region. Then, the method includes patterning the stack of layers in the second region of the semiconductor device. The patterning of the stack of layers in the second region removes a portion of the stack of layers in the second region, and exposes a side of the stack of layers. The method further includes covering at least the side of the stack of layers with a second layer that has a lower remove rate than the first layer, and then the method includes removing the hard mask layer.

In an embodiment, the first layer includes a sacrificial layer and the second layer includes an insulating layer. In some examples, the second layer has a lower remove rate in a wet etchant than the first layer. The wet etchant includes phosphoric acid. In some embodiments, the hard mask layer includes at least one of $Ta_2O_5$, $SrTiO_3$, $Al_2O_3$, TiN, W and polysilicon. The hard mask layer is removed by at least the wet etchant.

In some embodiments, the stack of layers includes a stack of sacrificial layers and insulating layers that are stacked alternatingly. The sacrificial layers include the first layer with the first remove rate in the wet etchant. In an example, to pattern the stack of layers in the second region of the semiconductor device, the method includes forming, in the second region, stair steps in the stack of sacrificial layers and insulating layers. Sides of the stair steps can expose the sacrificial layers.

In an embodiment, to cover at least the side of the first region with the second layer, the method includes depositing insulating filler material (e.g., silicon oxide) in the first region and the second region. The insulating filler material can overfill the second region. In an example, the insulating filler material includes silicon oxide. To deposit the silicon oxide, in an example, the method includes depositing the silicon oxide using tetraethoxysilane (TEOS). Then, the method includes removing the silicon oxide on the hard mask layer in the first region, and performing a chemical mechanical polishing (CMP) process that planarizes the silicon oxide in the second region to level with the hard mask layer in the first region. In an example, the CMP process stops on the hard mask layer. Then the hard mask layer can be removed.

In another embodiment, to cover at least the side of the stack of layers with the second layer, the method includes depositing a silicon oxide layer in the first region and the second region. The silicon oxide layer is conformal to the stair steps in the second region to cover the sacrificial layers exposed at the sides of the stair steps, and removing the silicon oxide layer on the hard mask layer in the first region. In an example, the silicon oxide layer is deposited using atomic layer deposition (ALD). Then, the silicon oxide layer is etched using an anisotropic etch. The anisotropic etch removes the silicon oxide layer in a direction perpendicular to a main surface of the semiconductor.

In another embodiment, to cover at least the side of the stack of layers with the second layer, the method includes oxidizing the sacrificial layers at the sides of the stair steps to form a silicon oxide layer corresponding to the second layer. In an example, in situ steam generation (ISSG) is used to oxidize the sacrificial layers.

In some examples, another method for fabricating a semiconductor device includes forming a stack of layers having a first region and a second region. The stack of layers includes at least a first layer. The method then includes forming a hard mask layer on the stack of layers in the first region. Then, the method includes patterning the stack of layers in the second region into stair steps, and depositing insulating filler material in the first region and the second region. The patterning of the stack of layers removes a portion of the stack of layers in the second region and thus opens a space in the stack of layers in the second region. The depositing of the insulating filler material canfill the space in the second region. Then, the method includes polishing the insulating material until the hard mask layer is exposed and removing the hard mask layer.

To remove the hard mask layer, in an example, the method includes removing the hard mask layer using a chemical mechanical polishing (CMP) process. In another example, the method includes removing the hard mask layer using a wet bench approach with phosphoric acid. In another example, the method includes a combination of a chemical mechanical polishing (CMP) process and a wet bench approach with phosphoric acid.

Aspects of the disclosure also provide a semiconductor device. The semiconductor device includes gate layers and insulating layers that are stacked alternatingly on a substrate of the semiconductor device. Further, the semiconductor device includes at least a stair step formed in the gate layers and insulating layers in a staircase region, and a sidewall insulating layer formed on a sidewall of the stair step between the stair step and an insulating filler material that fills a space in the staircase region.

In some embodiments, the sidewall insulating layer has a different density from the insulating filler material. In an embodiment, the sidewall insulating layer has a higher density than the insulating filler material.

In some examples, the sidewall insulating layer comprises silicon oxide, and the insulating filler material comprises silicon oxide. In an example, the sidewall insulating layer is formed based on atomic layer deposition (ALD). In another example, the sidewall insulating layer is formed based on in situ steam generation (ISSG). In some examples, the insulating filler material is formed based on tetraethoxysilane (TEOS).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, batch production can be preferred over single wafer production to achieve, for example, equipment cost reduction, processing cycle reduction, processing efficiency improvement, and the like. For example, hard mask can be used in semiconductor processing as an etch mask instead of a polymer or other organic resist material that is referred to as soft resist or soft mask. In some examples, the hard mask is formed of a material with higher dielectric constant (e.g., K is higher than 4) that is referred to as high-k material, such as $Ta_2O_5$, $SrTiO_3$, $Al_2O_3$, and the like. In other examples, the hard mask can include metal, such as TiN, W and the like. In other examples, the hard mask can include polysilicon. After the etching process, the hard mask may need to be removed. In some examples, a wet bench approach with phosphoric acid or a single wafer approach with sulfuric acid can be used to remove the hard mask. In the wet bench approach, a group of wafers, such as up to 50 wafers, are soaked in a phosphoric acid bath and are processed at the same time. In the single wafer approach, the processing equipment includes a chamber to hold a single wafer. The chamber is configured to provide sulfuric acid to remove the hard mask on the single wafer. In the single wafer approach, each wafer is respectively loaded into the chamber, processed in the chamber and unloaded from the chamber.

The wet bench approach may be preferred for higher productivity, however phosphoric acid may have relatively high etch rate to other materials, such as silicon nitride and the like, thus the use of phosphoric acid in the wet bench approach may cause damage to certain portions on the wafers, such as silicon nitride layers and the like.

In some embodiments, the hard mask is used to covers a first region on a stack of layers that extends in the first region and a second region of a semiconductor device. The stack of layers includes at least a first layer (e.g., silicon nitride) with a first remove rate in a wet etchant for removing the hard mask. Etching process can be performed on the stack of layers in the second region of the semiconductor device while the first region is protected by the hard mask. The etching of the stack of layers in the second region exposes at least the first layer from a side of the first region. The present disclosure provide techniques to cover at least the side of the first region with a second layer that has a lower remove rate in the wet etchant than the first layer. Thus, when the wet etchant is used to remove the hard mask, the second layer can protect the first layer.

In some examples, three-dimensional (3D) memory devices can be formed using a center drive architecture that disposes stairs configured for driving gates of transistors in a memory array in the middle of the memory array. For example, a staircase region is disposed between a first portion and a second portion of a memory array, and the first portion and the second portion of the memory array are connected by bridge portions. In some embodiments, to form stairs in the staircase region, the bridge portions can be protected by a hard mask. The hard mask needs to be removed after the formation of the stairs.

According to some aspects of the disclosure, the stairs are formed in films that include silicon nitride, and the use of wet bench approach with phosphoric acid may cause damage in the silicon nitride films. The present disclosure provides techniques to protect silicon nitride films, thus the wet bench approach with phosphoric acid can be used to remove the hard mask. In some embodiments, silicon oxide can be formed to prevent exposure of the silicon nitride films before the use of the wet bench approach with phosphoric acid to remove the hard mask. Silicon oxide has a lower remove rate than the silicon nitride in the phosphoric acid, and can protect the silicon nitride films when the wet bench approach with phosphoric acid is used.

FIGS. 1A-1D show an example of using a hard mask during a formation of stairs in a semiconductor memory device 100 according to some embodiments of the disclosure.

Figure 1A:
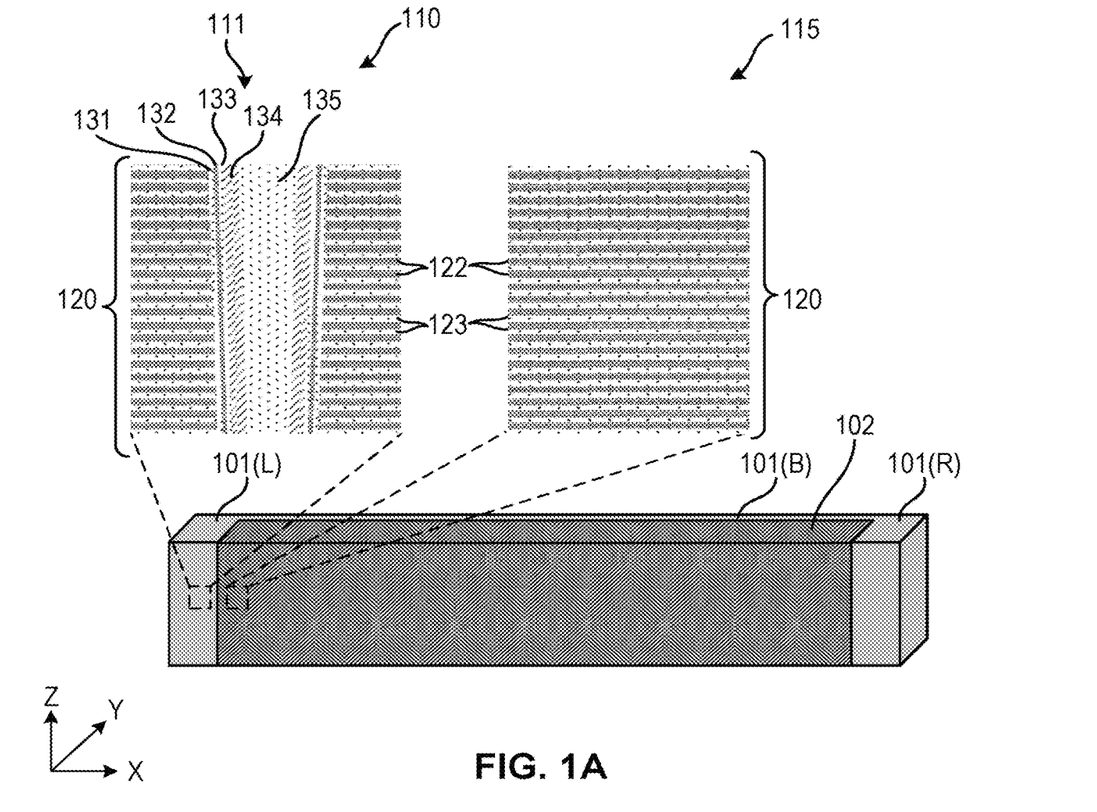
FIGS. 1A-1D show an exemplary usage of a hard mask during a fabrication of a semiconductor memory device according to some embodiments of the disclosure.

FIG. 1A shows a perspective view of a semiconductor memory device 100 before the formation of the stairs according to some embodiments of the disclosure. The semiconductor memory device 100 includes a memory array formed in an array region 101 (also referred to as a first region, e.g., shown as 101(L), 101(B) and 101(R)), and a staircase region 102 (also referred to as a second region) for forming contacts to gate layers of the memory array. The staircase region 102 is disposed at a center of the array region 101. For example, the array region 101 includes a left portion 101(L), a right portion 101(R) and bridge portion(s) 101(B). The left portion 101(L) and the right portion 101(R) are interconnected by the bridge portion(s) 101(B). In some examples, the staircase region 102 is surrounded by the left portion 101(L), the right portion 101(R), and the bridge portion(s) 101(B).

It is noted that the semiconductor memory device 100 can be any suitable device, for example, memory circuits, a semiconductor die with memory circuits formed on the semiconductor die, a semiconductor wafer with multiple semiconductor dies formed on the semiconductor wafer, a semiconductor chip with a stack of semiconductor dies bonded together, a semiconductor package that includes one or more semiconductor dies or chips assembled on a package substrate, and the like.

It is also noted that, the semiconductor memory device 100 can include other suitable circuitry (not shown), such as logic circuitry, power circuitry, and the like that is formed on the same substrate, or other suitable substrate, and is suitably coupled with the memory cell arrays.

Generally, the semiconductor memory device 100 includes a substrate (e.g., wafer substrate), and the memory array can be formed on the substrate. For simplicity, the main surface of the substrate is referred to as an X-Y plane, and the direction perpendicular to the main surface is referred to as Z direction.

In some embodiments, the memory array can be formed as an array of channel structures in a stack of layers, and the channel structures can be formed before the stairs. It is noted that the semiconductor memory device 100 can be formed by various fabrication technologies, such as gate-first technology, gate-last technology and the like. In the gate-first technology, gate layers can be formed before a formation of channel structures. In the gate-last technology, gate layers are formed by replacing sacrificial layers with gate layers after a formation of the channel structures. While gate-last technology is used in the following description to illustrate the techniques for removing hard mask, the description can be suitably modified for use in the gate-first technology.

FIG. 1A also shows an enlarged cross-sectional view (e.g., in Z-X plane) of a portion 110 of the semiconductor memory device 100. The portion 110 of the semiconductor memory device 100 is located in the array region 101. Other portions in the array region 101 can be similarly configured as the portion 110.

As shown by the portion 110, a channel structure 111 is formed in a stack 120 of sacrificial layers and insulating layers. In some embodiments, the stack 120 of sacrificial layers and insulating layers includes sacrificial layers 122 and insulating layers 123 that are stacked alternatingly. The sacrificial layers 122 and the insulating layers 123 are configured to form transistors that are stacked vertically. In some examples, the transistors formed in the stack 120 can include one or more bottom select transistors, memory cells, and one or more top select transistors. In some examples, the transistors can include one or more dummy select transistors. The sacrificial layers 122 will later be replaced by gate layers that correspond to gates of the transistors.

In some examples, the sacrificial layers 122 can be silicon nitride layers. The sacrificial layers 122 can be replaced later by gate layers that are made of gate stack materials, such as high dielectric constant (high-k) gate insulator layers, metal gate (MG) electrode, and the like. The insulating layers 123 are made of insulating material(s), such as silicon dioxide, and the like.

Further, the channel structure 111 is formed in the stack 120 of sacrificial layers and insulating layers and extends vertically (Z direction) into the stack 120. In some embodiments, the channel structure 111 has a pillar shape that extends in the Z direction that is perpendicular to the direction of the main surface of the substrate (e.g., X-Y plane). In an embodiment, the channel structure 111 is formed by materials in the circular shape in the X-Y plane, and extends in the Z direction. For example, the channel structure 111 includes function layers, such as a blocking insulating layer 131 (e.g., silicon dioxide), a charge storage layer (e.g., silicon nitride) 132, a tunneling insulating layer 133 (e.g., silicon dioxide), a semiconductor layer 134, and an insulating layer 135 that have the circular shape in the X-Y plane, and extend in the Z direction.

In an example to form the channel structure 111, an opening for the channel structure 111 can be formed into the stack 120 of sacrificial layers and insulating layers, and the opening is referred to as a channel hole. The blocking insulating layer 131 (e.g., silicon dioxide) is formed on the sidewall of the channel hole, and then the charge storage layer (e.g., silicon nitride) 132, the tunneling insulating layer 133, the semiconductor layer 134, and the insulating layer 135 are sequentially stacked from the sidewall. The semiconductor layer 134 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ cm$^{-3}$ in some examples. The insulating layer 135 is formed of an insulating material, such as silicon dioxide and/or silicon nitride, and/or may be formed as an air gap.

FIG. 1A also shows an enlarged cross-sectional view (e.g., in Z-X plane) of a portion 115 of the semiconductor memory device 100. The portion 115 of the semiconductor memory device 100 is located in the staircase region 102 and of a same range in the Z direction as the portion 110. The portion 115 includes the stack 120 of sacrificial layers and insulating layers.

The portion 115 includes the stack 120 of sacrificial layers and insulating layers that extends from the array region 101 into the staircase region 102. Stairs will be formed in the stack 120 of sacrificial layers and insulating layers within the staircase region 102.

During fabrication, in some examples, the stack 120 of sacrificial layers and insulating layers is formed in the array region 101 and the staircase region 102. For example, sacrificial layers and insulating layers for the stack 120 are deposited alternatingly on a substrate (not shown). The substrate can be any suitable substrate, such as a silicon (Si) substrate, a germanium (Ge) substrate, a silicon-germanium (SiGe) substrate, and/or a silicon-on-insulator (SOI) substrate. The substrate may be a bulk wafer or an epitaxial layer. In some examples, the insulating layers are made of insulating material(s), such as silicon dioxide, and the like, and the sacrificial layers are made of silicon nitride.

Further, channel structures, such as the channel structure 111 and the like, are formed in the stack 120 of sacrificial layers and insulating layers within the array region 101. For example, photo lithography technology is used to define patterns of channel holes in photoresist and/or hard mask layers, and etch technology is used to transfer the patterns into the stack 120 of sacrificial layers and insulating layers. Thus, channel holes are formed in the stack 120 of sacrificial layers and insulating layers in the array region 101.

Then, the channel structures, such as the channel structure 111 and the like, are formed in the channel holes. In an example, a blocking insulating layer (e.g., silicon dioxide) is formed on the sidewall of channel holes, and then the charge storage layer (e.g., silicon nitride), the tunneling insulating layer, the semiconductor layer, and the insulating layer are sequentially stacked from the sidewall.

It is noted that, the above fabrication process is merely an example to form the channel structure 111. The fabrication process can be suitably modified for forming other suitable channel structure, such as a channel structure based on a multi-deck technology that uses a joint structure to interconnect, for example two portions of the channel structure.

In some embodiments, stairs can be formed in the staircase region 102 after the channel structures are formed. In an example, a hard mask layer is deposited.

Figure 1B:
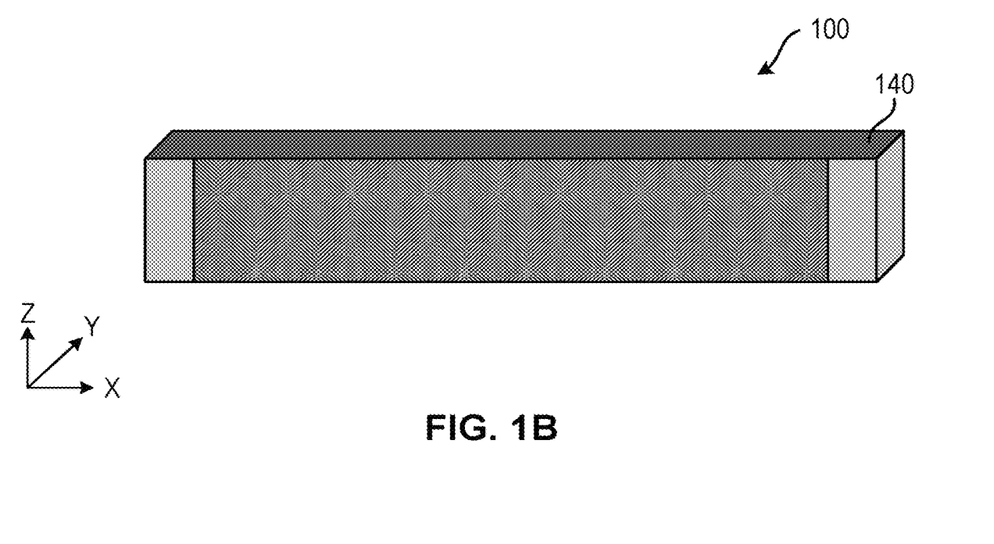

FIG. 1B shows a perspective view of the semiconductor memory device 100 after a deposition of a hard mask layer 140 according to some embodiments of the disclosure. In an example, the hard mask layer 140 is formed of a high-k material, such as $Ta_2O_5$, $SrTiO_3$, $Al_2O_3$, and the like. Other suitable material, such as TiN, W, polysilicon and the like can be used as the hard mask layer 140. It is noted that the hard mask layer 140 can include multiple layers of different materials in some embodiments. The hard mask layer 140 can be deposited by any suitable technique, such as chemical vapor deposition (CVD), low pressure CVD, plasma enhanced CVD, and the like.

Then, the hard mask layer 140 is suitably patterned to expose the staircase region 102.

Figure 1C:
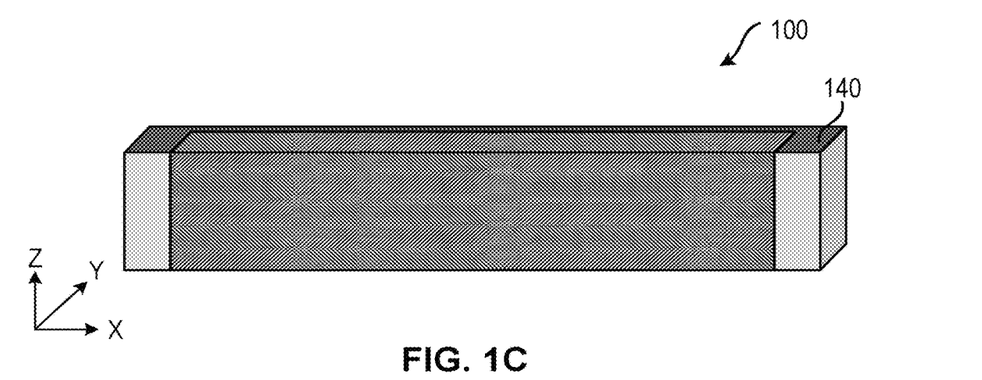

FIG. 1C shows a perspective view of the semiconductor memory device 100 after the hard mask layer 140 is patterned according to some embodiments of the disclosure. The hard mask layer 140 can be patterned using any suitable techniques. In an example, photo lithography technology is used to define patterns of the staircase region 102 from a photomask (referred to as a stair region photomask) in photoresist, and the etch technology is used to transfer the patterns in the photoresist into the hard mask layer 140. Thus, a portion of the hard mask layer 140 above the staircase region 102 is removed. The hard mask layer 140 can remain covering the array region 101.

Then, stairs are suitably formed in the staircase region 102.

Figure 1D:
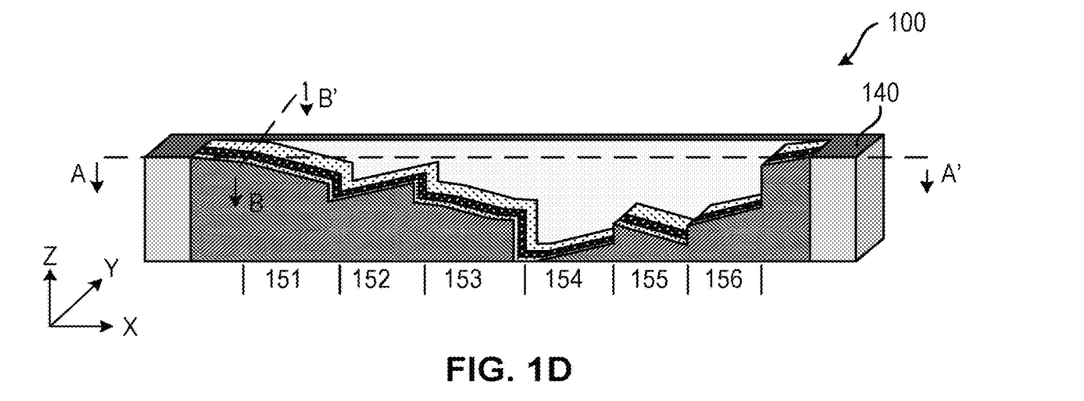

FIG. 1D shows a perspective view of the semiconductor memory device 100 after stairs are formed in the staircase region 102 according to some embodiments of the disclosure.

In some examples, stair steps are formed in the stack of alternatingly disposed sacrificial layers and the insulating layers according to a multi-level staircase architecture, such as disclosed in Applicant's co-pending application Ser. No. 16/684,844, filed Nov. 15, 2019, which is incorporated herein by reference in its entirety. For example, a three-level staircase architecture includes a section level, a group level and a division level. For example, the stack 120 can be divided into 6 section stack. Each section stack is further divided into 6 group stacks. Each group stack is then divided into 5 divisions. Each division includes a layer pair. In some embodiments, the stair steps to the different section stacks can be formed at the same time (e.g., in the same trim-etch cycles), and then chop processes are used to remove layers and shift stair steps of the different section stacks to the appropriate section layers. Thus, the total number of trim-etch cycles can be reduced.

In an example, a mask layer that is referred to as soft mask layer (not shown) can be used to form similar stair steps in multiple portions of the staircase region 102, such as the section regions 151-156. The soft mask layer covers the array region 101 and some portions of the staircase region 102. In some embodiments, the soft mask layer can include a photoresist or carbon-based polymer material, and can be formed using a patterning process such as lithography.

In some embodiments, the divisions of stair steps can be formed by applying a repetitive etch-trim process using the soft mask layer. The repetitive etch-trim process includes multiple cycles of an etching process and a trimming process. During the etching process, a portion of the stack with exposed surface (exposed from both the soft mask layer and the hard mask layer 140) can be removed. In an example, the etch depth equals to a pair of sacrificial layer and insulating layer. In an example, the etching process for the insulating layer can have a high selectivity over the sacrificial layer, and/or vice versa.

In some embodiments, the etching of the stack is performed by an anisotropic etching, such as a reactive ion etch (RIE) or other dry etch processes. In some embodiments, the insulating layer is silicon dioxide. In this example, the etching of silicon dioxide can include RIE using fluorine based gases such as carbon-fluorine (CF4), hexafluoroethane (C2F6), CHF3, or C3F6 and/or any other suitable gases. In some embodiments, a timed-etch approach can be used. In some embodiments, the sacrificial layer is silicon nitride. In this example, the etching of silicon nitride can include RIE using O2, N2, CF4, NF3, Cl2, HBr, BCl3, and/or combinations thereof. The methods and etchants to remove a single layer stack should not be limited by the embodiments of the present disclosure.

The trimming process includes applying a suitable etching process (e.g., an isotropic dry etch) on the soft mask layer such that the soft mask layer can be pulled back (e.g., shrink inwardly) laterally in the X-Y plane from edges. In some embodiments, the trimming process can include dry etching, such as RIE using O2, Ar, N2, etc.

After trimming the soft mask layer, one portion of the topmost level of the initial stack corresponding to, for example a stair step, is exposed and the other potion of the topmost level of the initial stack remains covered by the soft mask layer. The next cycle of etch-trim process resumes with the etching process. After forming the stair steps, the soft mask layer can be removed.

It is noted that, the soft mask layer above the bridge portion 101(B) may be pulled back during the trimming process, however the hard mask layer 140 still covers the bridge portion 101(B), and protects the bridge portion 101(B) from being etched during the etch-trim process.

Further, in some examples, group stair steps for the multiple staircase sections are formed in the top section layers. In some examples, a mask layer is used and trimming process is applied on the mask layer to form the etch masks for forming the group stair steps.

In some embodiments, the group stair steps can be formed by applying repetitive etch-trim process using the mask layer, similar to the repetitive etch-trim process to form the division stair steps. In an example, each group stair step includes multiple layer pairs, such as 6 layer pairs in an example. Then, an etching process etches suitable layers corresponding to the height of a group stair step, such as six layer pairs of alternating sacrificial layers and insulating layers.

In an example, by the etch-trim process, stair steps are formed in the top section layers (e.g., top 30 layer pairs for memory cells) of the stack 120 in the section regions 151-156. Further, chop process can be performed at different staircase section regions to shift the stair steps to the appropriate sections of the stack 120. The chop process applied to the section region 152 can remove 30 layer pairs; the chop process applied to the section region 153 can remove 60 layer pairs; the chop process applied to the section region 154 can remove 120 layer pairs; the chop process applied to the section region 155 can remove 90 layer pairs, etc.

It is noted that in the FIG. 1D example, the division stair steps are formed along the Y direction; the group stair steps are formed along the X direction. According to an aspect of the disclosure, because of the hard mask layer 140, the bridge portion 101(B) is protected from the etch processes during the formation of the stair steps. The sacrificial layers on the stair steps in the staircase region 102 are connected to the corresponding sacrificial layers in the bridge portion 101(B) and are connected to the corresponding sacrificial layers in other portions of the array region 101. Later, when the sacrificial layers are replaced by real gate layers and contacts are formed in the staircase region, the contacts can connect gate control lines, such as word lines to the gate terminals of the transistors that are stacked vertically.

In some embodiments, the etching of a lay pair (including an insulating layer and a sacrificial layer) is performed by an anisotropic etching such as a reactive ion etch (RIE) or other dry etch processes. In some embodiments, the insulating layer is silicon dioxide. In this example, the etching of silicon dioxide can include RIE using fluorine based gases such as carbon-fluorine (CF4), hexafluoroethane (C2F6), CHF3, or C3F6 and/or any other suitable gases. In some embodiments, the sacrificial layer is silicon nitride. In this example, the etching of silicon nitride can include RIE using 02, N2, CF4, NF3, Cl2, HBr, BCl3, and/or combinations thereof. The methods and etchants to remove a single layer stack should not be limited by the embodiments of the present disclosure.

After the stair steps are formed in the staircase region 102, the hard mask layer 140 can be removed.

It is noted that after the formation of the stair steps, sacrificial layers 122 are exposed from the sidewalls of the bridge portion 108 and from sides of the stair steps. The present disclosure provide techniques to remove the hard mask layer 140 using the wet bench approach with phosphoric acid without damaging the sacrificial layers 122. Specifically, in some embodiments, silicon nitride layers, such as the sacrificial layers 122, that are exposed due to the etch processes during the formation of stair steps, can be covered by silicon oxide before the removal of the hard mask layer 140. The covering by the silicon oxide can protect the silicon nitride layers from exposure to the phosphoric acid used in the wet bench approach to remove the hard mask layer 140.

Figure 2:
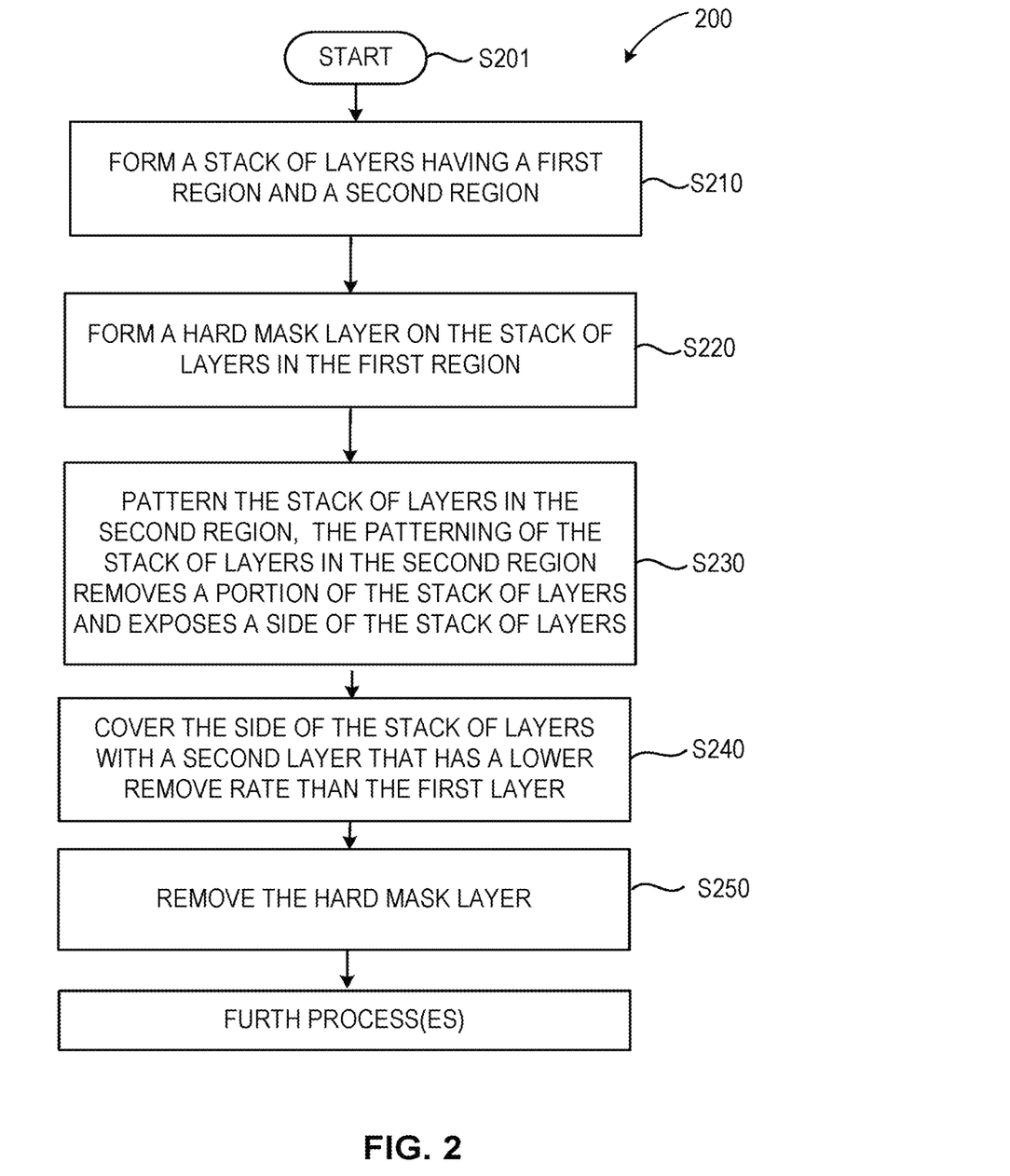
FIG. 2 shows a flow chart outlining a process example according to some embodiments of the disclosure.

FIG. 2 shows a flow chart outlining a process for fabricating a semiconductor device according to some embodiments of the disclosure. The process starts at S201 and proceeds to S210.

At S210, a stack of layers are formed. The stack of layers includes a first region and a second region. The stack of layers includes at least a first layer. In an example, the stack 120 of sacrificial layers 122 and insulating layers 123 is formed in the array region 101 and the staircase region 102.

At S220, a hard mask layer is formed on the stack of layers in the first region. For example, the hard mask layer 140 is formed. The hard mask layer 140 covers the array region 101.

At S230, the stack of layers in the second region is patterned into stair steps. The patterning of the stack of layers in the second region removes a portion of the stack of layers, and exposes a side of the stack of layers. For example, the staircase region 102 can be patterned to form stair steps. The sacrificial layers 122 can be exposed from the sides of the stair steps and the sidewall of the bridge portions 101(B).

At S240, the side of the stack of layers is covered with a second layer that has a lower remove rate (e.g., in a wet etchant) than the first layer. In an example, the second layer is silicon oxide that can be formed on the sidewalls of the bridge portion 101(B) and at the sides of the stair steps to protect sacrificial layer(s) that is the first layer in some examples. The silicon oxide has a lower remove rate in phosphoric acid than the silicon nitride that can be used for the sacrificial layers. Various techniques can be used, and will be described in detail with regards to FIGS. 3A-3D, FIGS. 4A-4E and FIGS. 5A-5D.

At S250, the hard mask layer is removed. For example, the hard mask layer 140 can be removed by the wet bench approach with phosphoric acid. Then, the process continues.

Figure 3A:
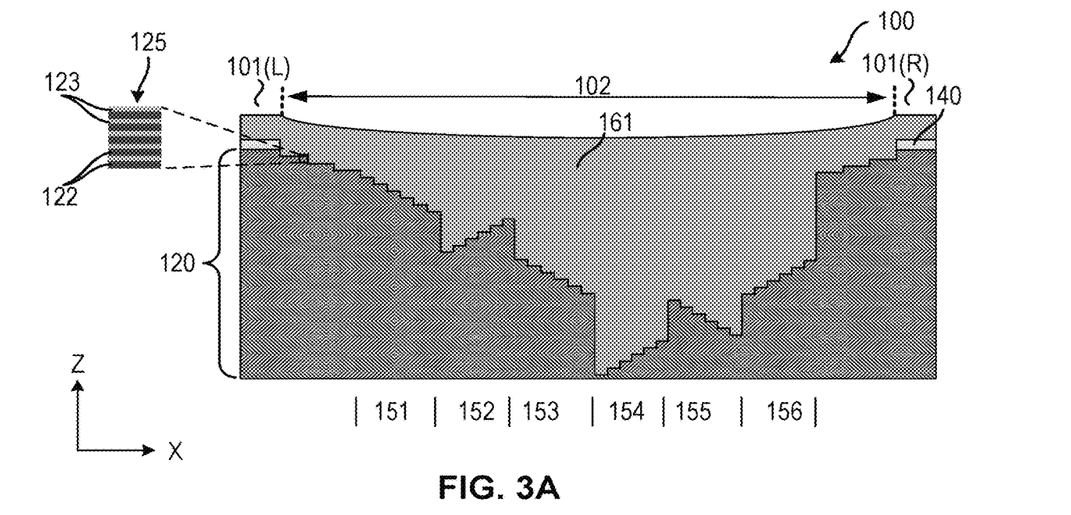
FIGS. 3A-3D show an exemplary technique to remove a hard mask layer according to an embodiment of the disclosure.
Figure 3B:
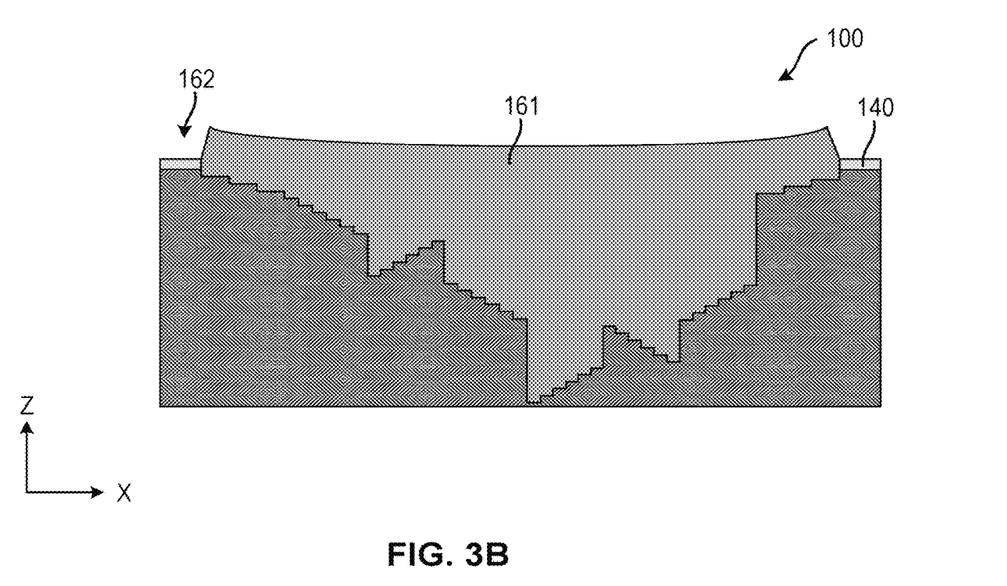

FIGS. 3A-3D show an example of a technique to remove the hard mask layer according to an embodiment of the disclosure. The technique can deposit an insulating layer for planarization, and then expose the hard mask and remove the hard mask. FIGS. 3A-3D show cross-sectional views (e.g., in Z-X plane) of a semiconductor memory device, such as the semiconductor memory device 100 along A-A' line shown in FIG. 1D. It is noted that while FIG. 3A-3B show cross-sectional views along A-A' line, the views can be suitably adjusted for cross-sectional views along B-B' line.

FIG. 3A shows a cross-section view of the semiconductor memory device 100 after a deposition of an insulating layer that is used for planarization. In the FIG. 3A example, in the staircase region 102, the group stair steps are formed in the X direction, each group stair step includes 5 layer pairs. For example, FIG. 3A shows an enlarged view of a group step 125 having five sacrificial layers 122 and five insulating layers 123 that are stacked alternatingly. It is noted that the group stair step can include other suitable number of layer pairs, such as 3, 4, 6, 7 and the like.

In the FIG. 3A example, insulating filler material 161 is deposited. In some examples, the insulating filler material 161 is used for planarization and overfills the staircase region 102. In an example, the insulating filler material 161 is formed using tetraethoxysilane (TEOS). TEOS is converted to silicon oxide that is deposited as the insulating filler material 161. TEOS can overfill the insulating filler material 161 in the staircase region 102 than the array region 101, and reduce the unevenness between the staircase region 102 and the array region 101.

The deposition of the insulating filler material 161 covers the surface that includes both the array region 101 and the staircase region 102. Then, the array region 101 can be exposed.

FIG. 3B shows a cross-sectional view (e.g., in Z-X plane) of the semiconductor memory device 100 after the array region 101 is exposed. For example, photo lithography process is used to define patterns of the array region 101 from a photomask (referred to as array region photomask) in photoresist, and etch process is used to transfer the patterns from the photoresist into the insulating filler material 161. The etch process can stop on the hard mask layer 140. Due to etch profile, most of the hard mask layer 140 is exposed, and some hard mask layer 140 may be still covered by the insulating filler material 161.

In some embodiments, a suitable planarization process is performed to obtain a relatively flat surface. In an example, a chemical mechanical polishing (CMP) process is applied to remove excess insulating filler material 161, and the hard mask layer 140 can be used as a stop layer for the CMP process.

Figure 3C:
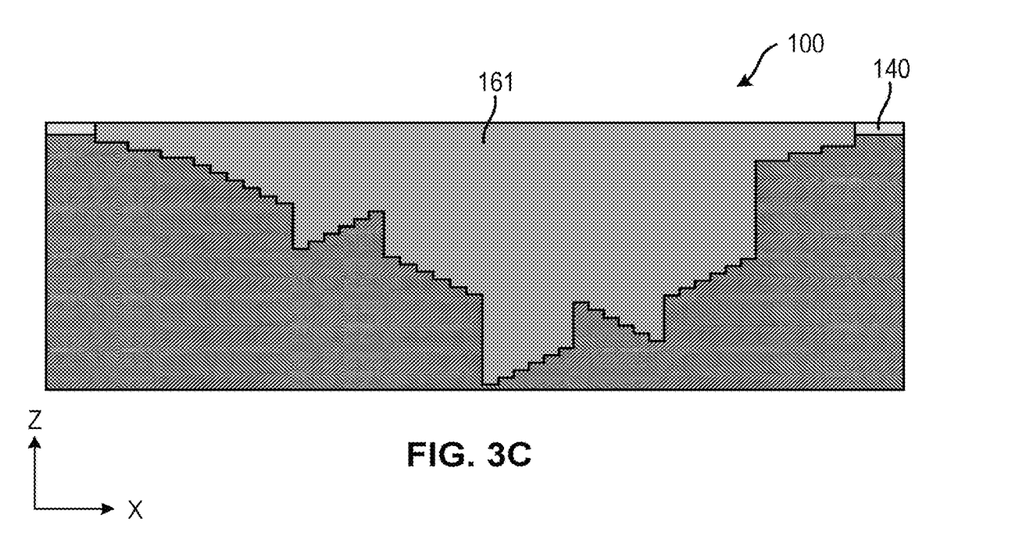

FIG. 3C shows a cross-sectional view (e.g., in Z-X plane) of the semiconductor memory device 100 after the planarization process. After the planarization process, the hard mask layer 140 can be fully exposed. It is noted that the staircase region 102 are covered by the insulating filler material 161 that can protect the sacrificial layer 122 exposed from the sidewall of the bridge portion 101(B) and from the sides of the stair steps.

Then, the hard mask layer 140 can be suitably removed. In an embodiment, the hard mask layer 140 is removed by another CMP process that can remove high-k material. In another embodiment, the hard mask layer 140 is removed by the wet bench approach with phosphoric acid. In another example, the hard mask layer 140 is removed by a combination of CMP process and the wet bench approach with phosphoric acid.

Figure 3D:
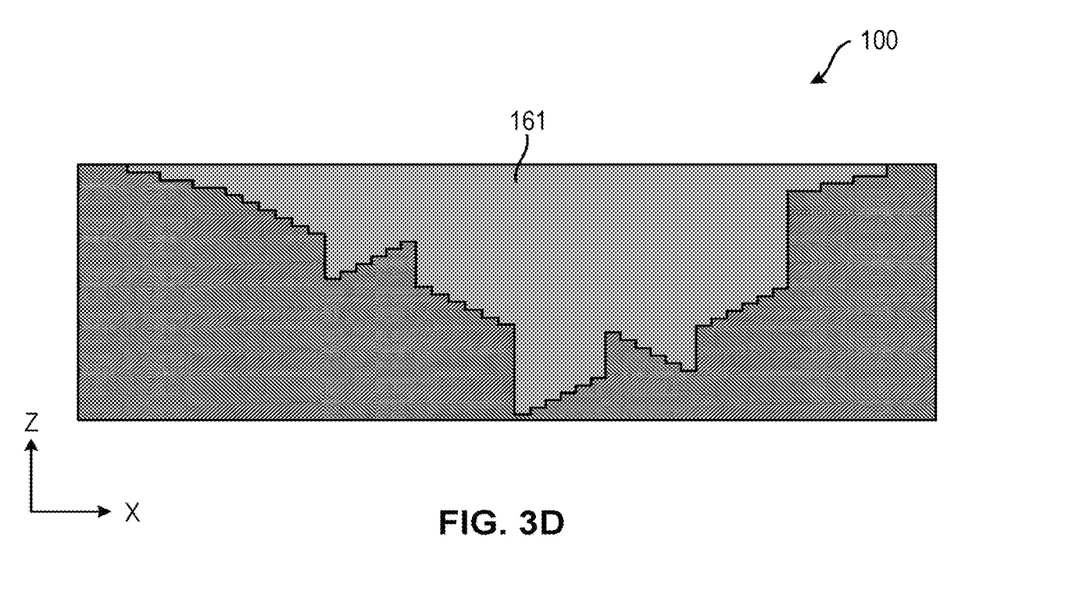

FIG. 3D shows a cross-sectional view (e.g., in Z-X plane) of the semiconductor memory device 100 after the hard mask layer 140 is removed. The fabrication process can continue, for example, to replace the sacrificial layers with gate layers, to form contacts, and to form metal layers, and the like.

FIGS. 4A-4E show an example of another technique to remove the hard mask layer according to an embodiment of the disclosure. The technique can form a thin insulating layer on sidewalls in the staircase region to protect the sacrificial layer during the removal of the hard mask. FIGS. 4A-4E show cross-sectional views (e.g., in Z-Y plane) of a semiconductor memory device, such as the semiconductor memory device 100 along B-B' line shown in FIG. 1D. It is noted that while FIG. 4A-4E show cross-sectional views along B-B' line, the views can be suitably adjusted for cross-sectional views along A-A' line.

Figure 4A:
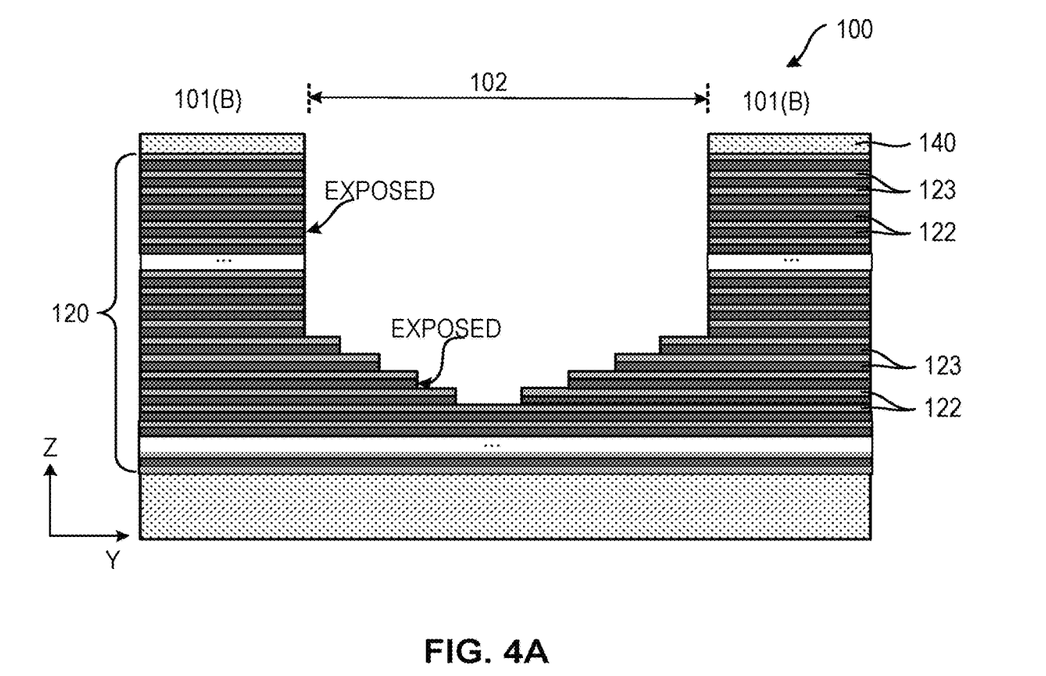
FIGS. 4A-4E show another exemplary technique to remove a hard mask layer according to an embodiment of the disclosure.

FIG. 4A shows a cross-sectional view of the semiconductor memory device 100 after the stair steps are formed in the staircase region 102. In the FIG. 4A example, in the staircase region 102, the division stair steps are formed in the Y direction, each division stair step includes one layer pair (one sacrificial layer 122 and one insulating layer 123). As shown in FIG. 4A, the bridge portions 101(B) are protected by the hard mask layer 140 during the formation of the staircase, the sacrificial layers 122 can be exposed at the sidewalls of the bridge portions 101(B) and sides of the stairs.

Then, an insulating layer 162 is deposited. In an example, the insulating layer 162 includes silicon oxide that is deposited using atomic layer deposition (ALD). Thus, the insulating layer 162 is relatively thin and conformal to the stair steps.

Figure 4B:
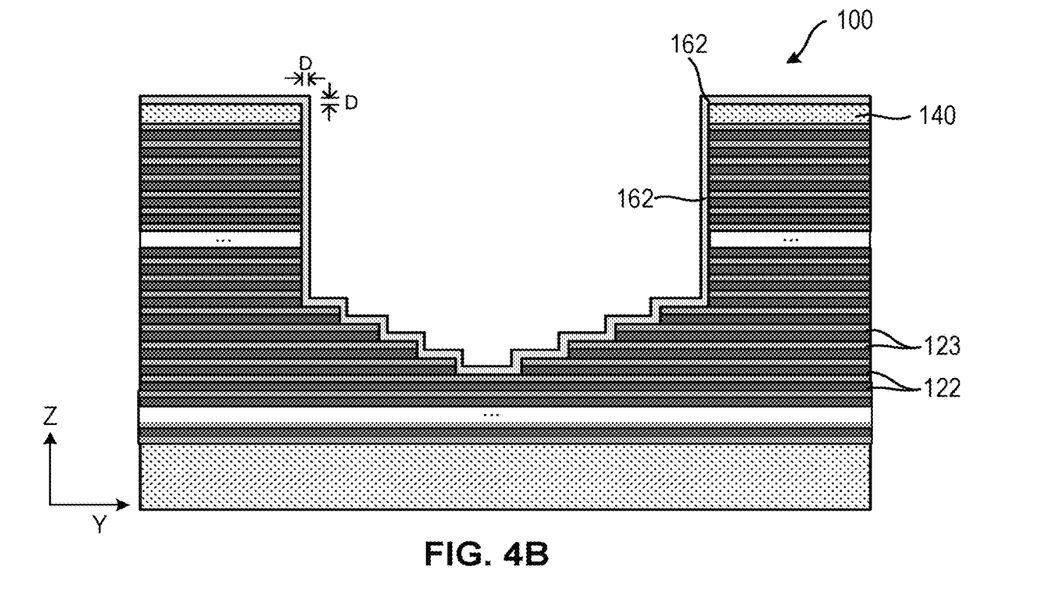

FIG. 4B shows a cross-sectional view of the semiconductor memory device 100 after the deposition of the insulating layer 162. In the FIG. 4B example, the insulating layer 162 is conformal to shapes of the stair steps in the staircase region 102. For example, the insulating layer 162 has about the same thickness (D), for example, on the top surface of the hard mask layer 140, on the sidewall of the bridge portions 101(B), on the top surface of the stair steps, on the sides of the stair steps, and the like.

Further, an etch process can be performed to thin and/or remove the insulating layer 162 in Z direction. In an example, an anisotropic etch process can be used to remove the insulating layer 162 on the top surface of the hard mask layer 140, and on the top surface of the stair steps, but leave the insulating layer 162 on the sidewall of the bridge portions 101(B) and the sides of the stair steps. The anisotropic etch process can etch the insulating layer 162 in the Z direction, thus most of the insulating layer 162 on the sidewalls remains on the sidewall and can protect the sacrificial layer 122 from exposure to etchant during the removal of the hard mask layer 140. The insulating layer 162 on the sidewalls can be referred to as sidewall insulating layer.

Figure 4C:
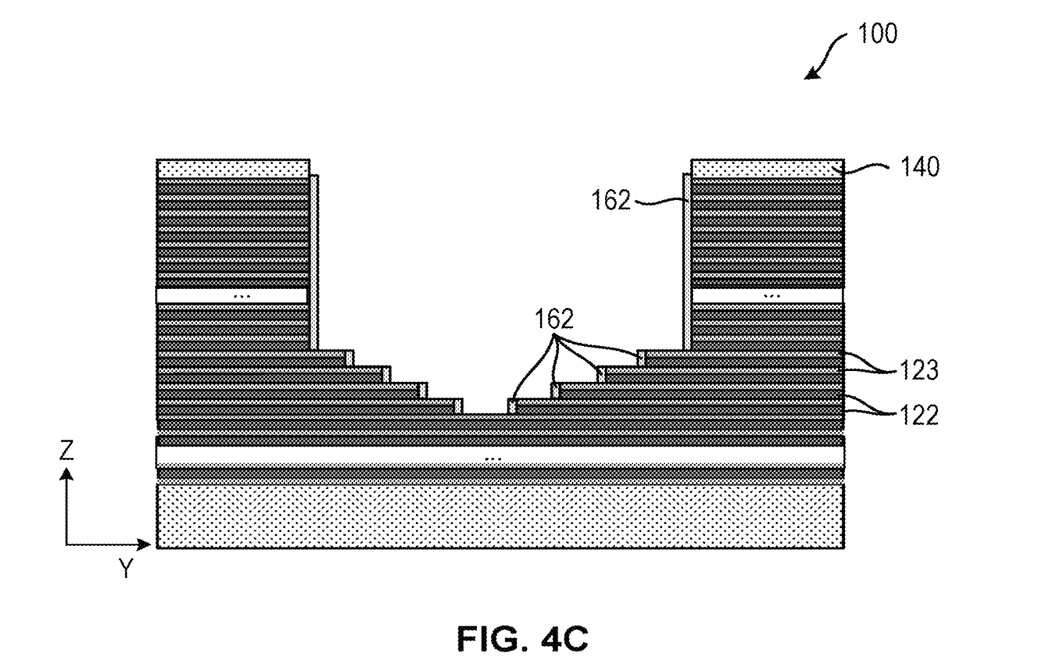

FIG. 4C shows a cross-sectional view of the semiconductor memory device 100 after the etch process. As shown in FIG. 4C, the sidewall of the bridge portions 101(B) and the sides of the stair steps are covered by the insulating layer 162. The anisotropic etch process removes the insulating layer 162 on the hard mask layer 140 and the insulating layer 162 on the top surface of the stair steps. It is noted that each stair step includes an insulating layer 123 on top of a sacrificial layer 122. When the insulating layer 162 on the top surface of a stair step is removed, the insulating layer 123 remains protecting the top surface of the sacrificial layer 122, and the sides of the sacrificial layer 122 can be protected by the insulating layer 162.

Then, the wet bench approach with phosphoric acid can be applied to remove the hard mask layer 140.

Figure 4D:
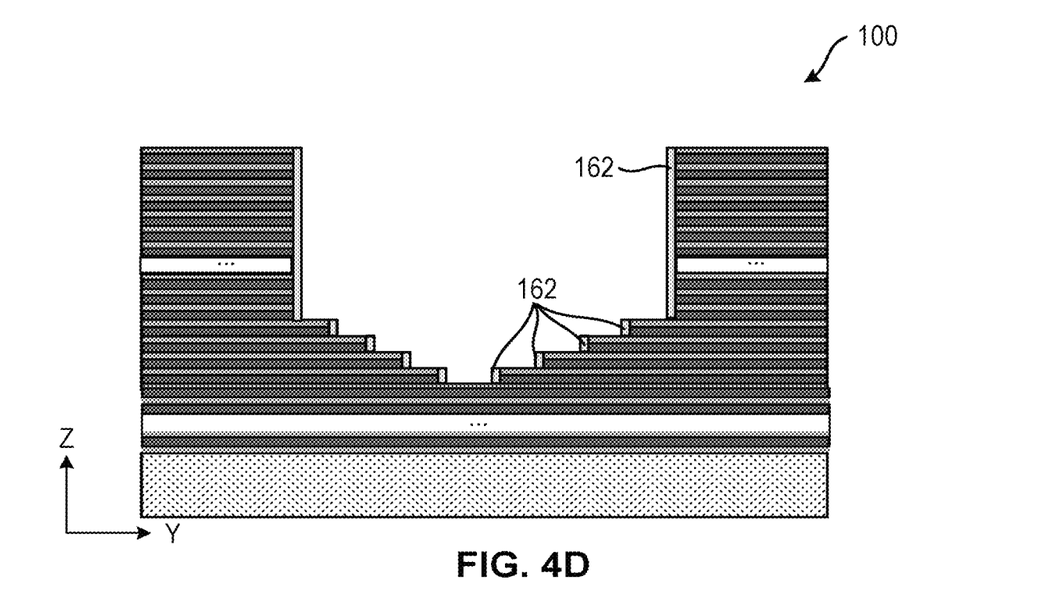

FIG. 4D shows a cross-sectional view of the semiconductor memory device 100 after the wet bench approach with phosphoric acid. As shown by FIG. 4D, the hard mask layer 140 is removed. Because the sidewalls of the bridge portions 101(B), the sides of the stair steps are covered by the insulating layer 162, the top surfaces of the stair steps are covered by the insulating layers 123, thus the sacrificial layers 122 are protected from damage by the phosphoric acid.

Then, the fabrication process can continue, for example, to perform planarization, to replace the sacrificial layers with gate layers, to form contacts, and to form metal layers, and the like.

Figure 4E:
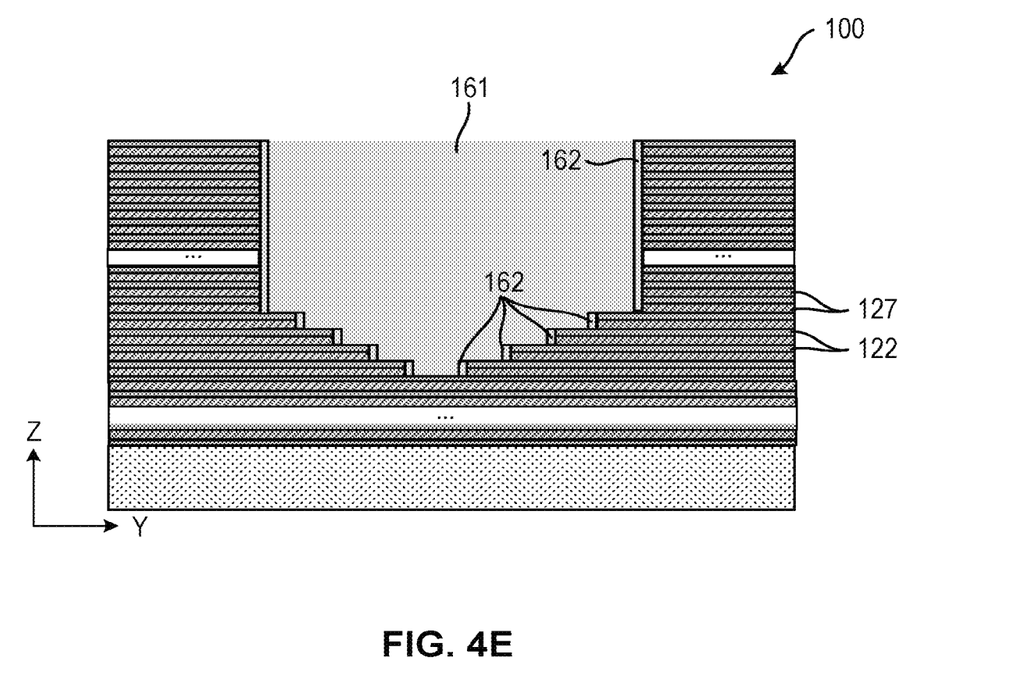

FIG. 4E shows a cross-sectional view of the semiconductor memory device 100. As shown by FIG. 4E, insulating filler material 161 can be used for planarization. Further, sacrificial layers 123 are replaced with gate layers 127. In some examples, the insulating layer 162 is silicon oxide deposited using ALD process, and the insulating filler material 161 is silicon oxide deposited using TEOS based deposition process. The insulating layer 162 can have a higher density than the insulating filler material 161.

FIGS. 5A-5D show an example of another technique to remove the hard mask layer according to an embodiment of the disclosure. The technique can form a thin insulating layer on sidewalls in the staircase region to protect the sacrificial layer during the removal of the hard mask. FIGS. 5A-5D show cross-sectional views (e.g., in Z-Y plane) of a semiconductor memory device, such as the semiconductor memory device 100 along B-B' line shown in FIG. 1D. It is noted that while FIG. 5A-5D show cross-sectional views along B-B' line, the views can be suitably adjusted for cross-sectional views along A-A' line.

Figure 5A:
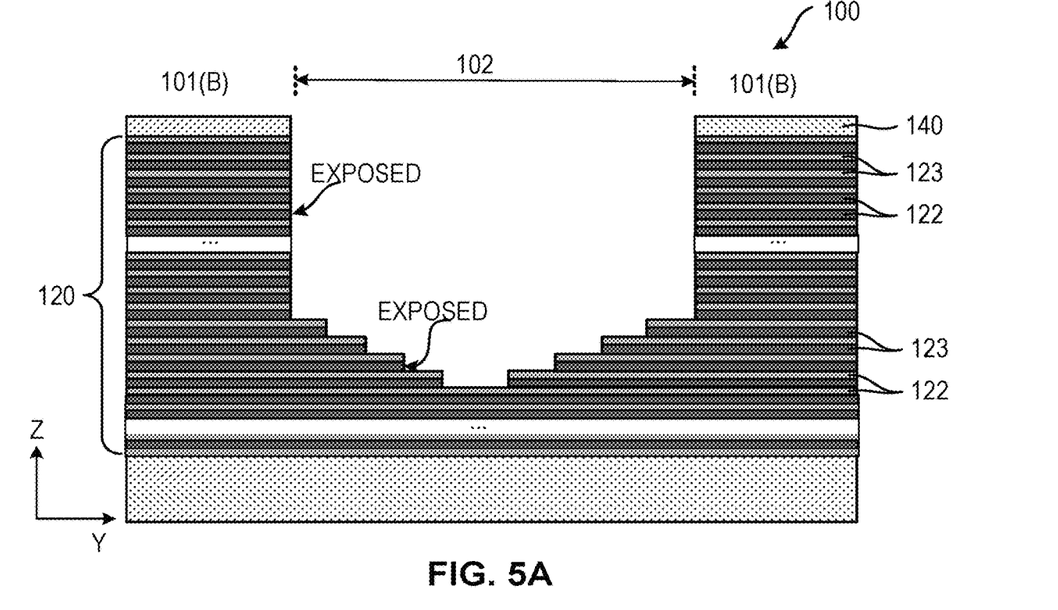
FIGS. 5A-5D show an exemplary technique to remove a hard mask layer according to an embodiment of the disclosure.

FIG. 5A shows a cross-sectional view of the semiconductor memory device 100 after the stair steps are formed in the staircase region 102. In the FIG. 5A example, in the staircase region 102, the division stair steps are formed in the Y direction, each division stair step includes one layer pair (one sacrificial layer 122 and one insulating layer 123). As shown in FIG. 5A, the bridge portions 101(B) are protected by the hard mask layer 140 during the formation of the staircase, the sacrificial layers 122 can be exposed at the sidewalls of the bridge portions 101(B) and sides of the stair steps.

In some examples, after the formation of the stair steps in the staircase region 102, the semiconductor memory device 100 is processed based on in situ steam generation (ISSG) to oxidize the sacrificial layers 122 from the sides and form silicon oxide on the sidewall of the bridge portions 101(B) and the sides of the stair steps.

ISSG is a low-pressure process (typically below 20 torr) wherein pre-mixed $H_2$ and $O_2$ are introduced to a process chamber directly, without pre-combustion. Process gases (e.g., pure $H_2$ and $O_2$) are mixed in a plenum and are then injected into a chamber, where the process gases flow across a rotating wafer heated by tungsten-halogen lamps. The reaction between $H_2$ and $O_2$ occurs close to the wafer surface because the hot wafer acts as the ignition source. ISSG can cause exposed silicon nitride to oxidize and form silicon oxide.

Figure 5B:
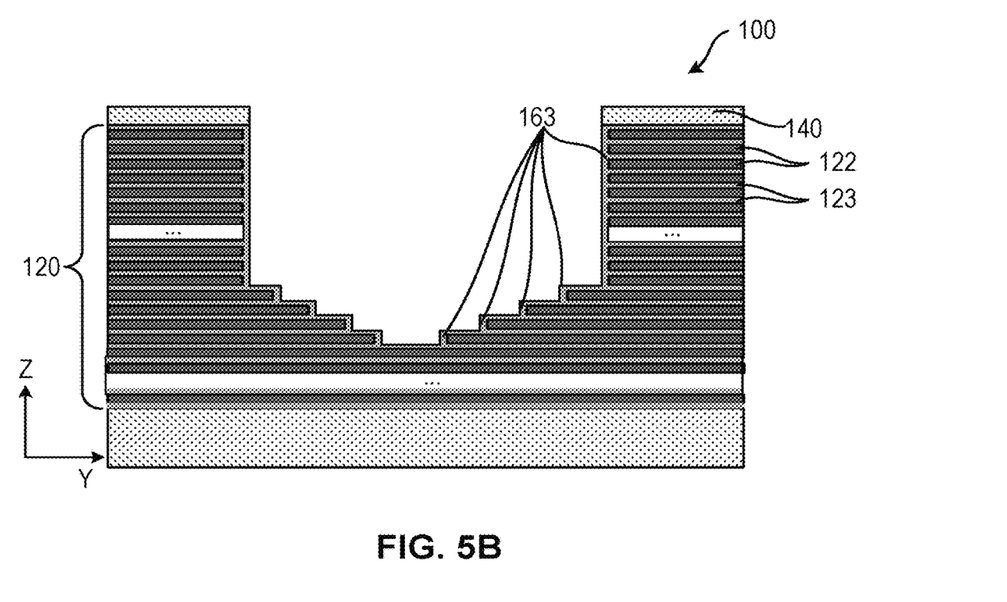

FIG. 5B shows a cross-sectional view of the semiconductor memory device 100 after the ISSG process. In the FIG. 5B example, the ISSG causes the sacrificial layers 122 that are exposed from the sidewalls of the bridge portions 101(B) and from the sides of the stair steps to oxidize and form silicon oxide layer 163 that covers the sidewalls of the bridge portions 101(B) and covers the sides of the stair steps. The silicon oxide layer 163 that covers the sidewalls of the bridge portions 101(B) and the covers the sides of the stair steps can be referred to as sidewall insulating layer.

Then, the wet bench approach with phosphoric acid can be applied to remove the hard mask layer 140.

Figure 5C:
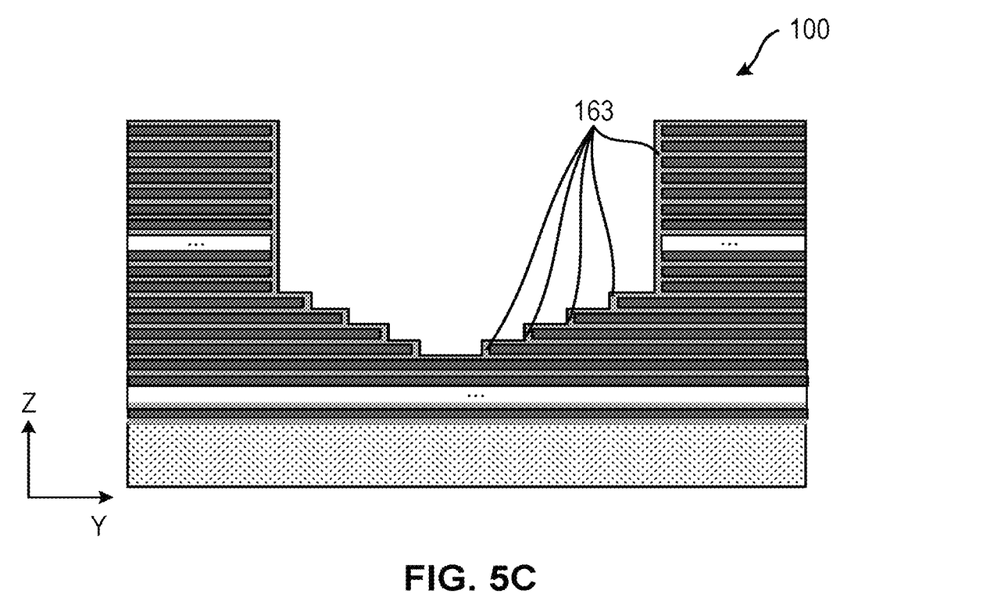

FIG. 5C shows a cross-sectional view of the semiconductor memory device 100 after the wet bench approach with phosphoric acid. As shown by FIG. 5C, the hard mask layer 140 is removed. Because the sidewalls of the bridge portions 101(B), the sides of the stair steps are covered by the insulating layer 163, the top surfaces of the stair steps are covered by the insulating layers 123, thus the sacrificial layers 122 are protected from damage by the phosphoric acid.

Then, the fabrication process can proceed, for example to perform planarization, to replace the sacrificial layers with gate layers, to form contacts, and to form metal layers, and the like.

Figure 5D:
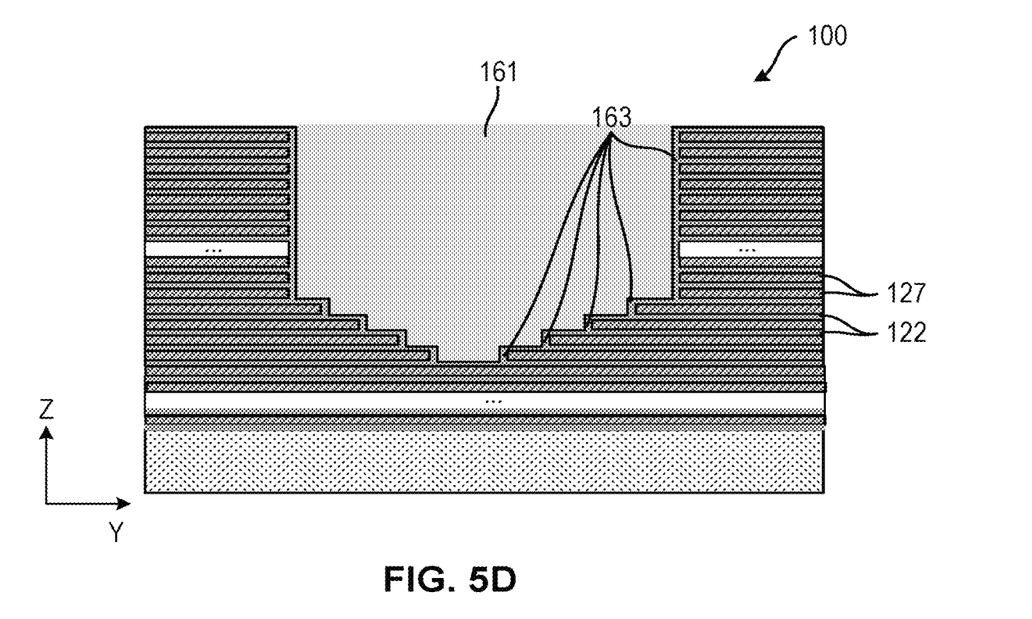

FIG. 5D shows a cross-sectional view of the semiconductor memory device 100. As shown by FIG. 5D, insulating filler material 161 can be used for planarization. Further, the sacrificial layers 123 are replaced with gate layers 127. In some examples, the insulating layer 163 is silicon oxide formed using the ISSG process, and the insulating filler material 161 is silicon oxide deposited using TEOS based deposition process. The insulating layer 163 can have a higher density than the insulating filler material 161.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:

forming a stack of layers having a first region and a second region, the stack of layers including at least a first layer;

forming a hard mask layer on the stack of layers in the first region of the semiconductor device;

patterning the stack of layers in the second region of the semiconductor device, the patterning of the stack of layers in the second region removing a portion of the stack of layers in the second region, and exposing a side of the stack of layers;

depositing in the first region and the second region a second layer that has a lower remove rate than the first layer, the second layer overfilling the portion of the stack of layers in the second region and covering the side of the stack of layers and the hard mask layer in the first region;

removing a portion of the second layer that covers a portion of the hard mask layer to expose the portion of the hard mask layer, with a remaining portion of the hard mask layer still covered by the second layer;

planarizing a remaining portion of the second layer that is in the second region and still covers the remaining portion of the hard mask layer until the second layer is leveled with the exposed portion of the hard mask layer and the remaining portion of the hard mask layer is exposed; and removing the hard mask to expose the stack of layers in the first region of the semiconductor device and planarizing the second layer such that the second layer is leveled with the exposed stack of layers in the semiconductor device, wherein no intermediate step is performed between removing the portion of the second layer and planarizing the remaining portion of the second layer.

2. The method of claim 1, wherein the first layer includes a sacrificial layer and the second layer includes an insulating layer.

3. The method of claim 1, wherein the hard mask layer is removed by at least a wet etchant hat comprises phosphoric acid.

4. The method of claim 1, wherein the stack of layers comprises a stack of alternatingly stacked sacrificial layers and insulating layers, and the sacrificial layers include the first layer.

5. The method of claim 4, wherein patterning the stack of layers in the second region of the semiconductor device further comprises:

forming, in the second region, stair steps in the stack of alternatingly stacked sacrificial layers and insulating layers, sides of the stair steps exposing the sacrificial layers.

6. The method of claim 5, wherein covering at least the side of the stack of layers with the second layer that has the lower remove rate than the first layer further comprises:
depositing the second layer in the first region and the second region, the second layer overfilling the second region.

7. The method of claim 6, wherein depositing the second layer further comprises:
depositing silicon oxide using tetraethoxysilane (TEOS).

8. The method of claim 1, wherein the remaining portion of the second layer is planarized by a chemical mechanical polishing (CMP) process.

9. The method of claim 8, wherein the CMP process stops on the hard mask layer.

10. The method of claim 1, wherein the hard mask layer is formed of a material with a dielectric constant higher than 4.

11. The method of claim 10, wherein the hard mask layer comprises at least one of $Ta_2O_5$, $SrTiO_3$, $Al_2O_3$, TiN, W, or polysilicon.

12. A method for fabricating a semiconductor device, comprising:
forming a stack of layers having a first region and a second region;
forming a hard mask layer on the stack of layers in the first region;
patterning the stack of layers in the second region into stair steps, the patterning of the stack of layers in the second region removing a portion of the stack of layers in the second region and forming a space in the second region;
depositing insulating filler material in the first region and the second region, the insulating filler material filling the space in the second region;
removing a portion of the insulating filler material that covers a portion of the hard mask layer to expose the portion of the hard mask layer, with a remaining portion of the hard mask layer still covered by the insulating filler material;
planarizing a remaining portion of the insulating filler material that is in the second region and still covers the remaining portion of the hard mask layer until the insulating filler material is leveled with the exposed portion of the hard mask layer and the remaining portion of the hard mask is exposed; and
removing the hard mask to expose the stack of layers in the first region of the semiconductor device and planarizing the insulating filler material such that the insulating filler material is leveled with the exposed stack of layers in the semiconductor device,
wherein no intermediate step is performed between removing the portion of the insulating filler material and planarizing the remaining portion of the insulating filler material.

13. The method of claim 12, wherein removing the hard mask layer further comprises:
removing the hard mask layer using a chemical mechanical polishing (CMP) process.

14. The method of claim 12, wherein removing the hard mask layer further comprises:
removing the hard mask layer using a wet bench approach with phosphoric acid.

15. The method of claim 12, wherein removing the hard mask layer further comprises:
removing the hard mask layer using a combination of a chemical mechanical polishing (CMP) process and a wet bench approach with phosphoric acid.

16. The method of claim 12, wherein the hard mask layer is formed of a material with a dielectric constant higher than 4.

17. The method of claim 16, wherein the hard mask layer comprises at least one of $Ta_2O_5$, $SrTiO_3$, $Al_2O_3$, TiN, W, or polysilicon.

18. The method of claim 17, wherein patterning the stack of layers in the second region into stair steps further comprises:
forming, in the second region, the stair steps in the stack of alternatingly stacked sacrificial layers and insulating layers, sides of the stair steps exposing the sacrificial layers.

19. The method of claim 12, wherein the stack of layers comprises a stack of alternatingly stacked sacrificial layers and insulating layers.

20. The method of claim 12, wherein depositing the insulating filler material further comprises:
depositing silicon oxide using tetraethoxysilane (TEOS).

* * * * *